(12) United States Patent
Geha

(10) Patent No.: US 6,309,971 B1
(45) Date of Patent: Oct. 30, 2001

(54) HOT METALLIZATION PROCESS

(75) Inventor: Sam G. Geha, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 08/693,978

(22) Filed: Aug. 1, 1996

(51) Int. Cl.[7] .................................................. H01L 21/44
(52) U.S. Cl. .................... 438/688; 438/680; 438/799; 438/660; 438/663
(58) Field of Search ......................... 437/197; 438/799, 438/408, 688, 680, 660, 663; 458/799

(56) References Cited

U.S. PATENT DOCUMENTS

| | | | |
|---|---|---|---|
| 4,600,658 | 7/1986 | Anderson et al. | 428/450 |
| 4,786,962 | 11/1988 | Koch | 357/71 |
| 4,970,176 | * 11/1990 | Tracy et al. | 437/187 |
| 5,108,570 | 4/1992 | Wang | 204/192.3 |
| 5,267,607 | 12/1993 | Wada | 165/80.1 |
| 5,270,255 | 12/1993 | Wong | 437/194 |
| 5,288,665 | 2/1994 | Nulman | 437/194 |
| 5,312,512 | 5/1994 | Allman et al. | 156/636 |
| 5,360,524 | 11/1994 | Hendel et al. | 204/192.25 |
| 5,371,042 | 12/1994 | Ong | 437/194 |
| 5,378,660 | 1/1995 | Ngan et al. | 437/247 |
| 5,380,678 | 1/1995 | Yu et al. | 437/190 |
| 5,443,995 | * 8/1995 | Nulman | 437/197 |
| 5,470,792 | 11/1995 | Yamada | 437/155 |

FOREIGN PATENT DOCUMENTS

| | | |
|---|---|---|
| 0 223 787 B1 | 11/1986 | (EP) . |
| 0 420 595 B1 | 4/1991 | (EP) . |
| 0 420 597 B1 | 4/1991 | (EP) . |
| 0 425 084 B1 | 5/1991 | (EP) . |
| 0 439 128 B1 | 7/1991 | (EP) . |
| 0451571A2 | 10/1991 | (EP) . |
| 0451740A2 | 10/1991 | (EP) . |
| 0499241A1 | 8/1992 | (EP) . |
| 0425084 | * 3/1996 | (EP) . |
| 0790641A1 | 8/1997 | (EP) . |

OTHER PUBLICATIONS

Zheng Xu et al., *Al planarization processes for multilayer metallization of quarter micrometer devices*, Thin Solid Films 253 (1994), Elsevier Science S.A., pp. 367–371.

Zheng Xu et al., *Planar Multilevel Metallization Technologies for ULSI Devices*, SPIE, vol. 2335, pp. 70–79.

Singer, Pete, "The Interconnect Challenge: Filling Small, High Aspect Ratio Contact Holes," *Semiconductor International*, Aug. 1994, pp. 57–64.

* cited by examiner

*Primary Examiner*—David Nelms
*Assistant Examiner*—Renee' R. Berry
(74) *Attorney, Agent, or Firm*—David R. Graham

(57) ABSTRACT

The invention enables a layer of metal to be formed on a substrate with few or no voids formed in the layer, with increased throughput and without raising the temperature of the substrate to a level that may damage the substrate. A layer of metal can be formed on a substrate using a cold deposition step followed by a hot deposition step. The cold deposition step need only be performed for a time sufficient to deposit metal over the entire surface on which the metal layer is to be formed. In the hot deposition step, further metal is deposited while the substrate is rapidly heated to a target temperature. The rapid heating quickly mobilizes the atoms of the deposited metal, making the deposited metal far less susceptible to cusping and voiding than has been the case with previous methods for depositing a metal layer on a substrate that include a cold deposition step followed by a hot deposition step. In particular, the rapid heating of the substrate can be accomplished by, for example, flowing a heated gas against the substrate at a flow rate that is higher than heretofore thought feasible.

22 Claims, 4 Drawing Sheets

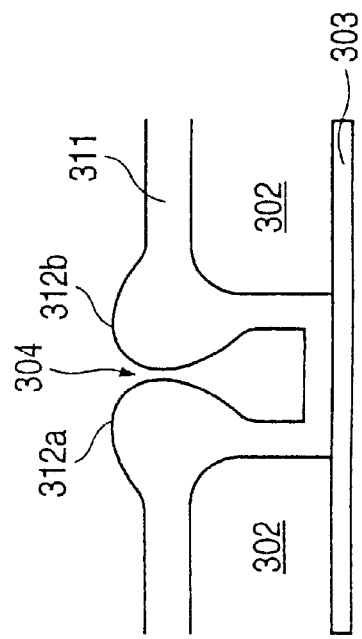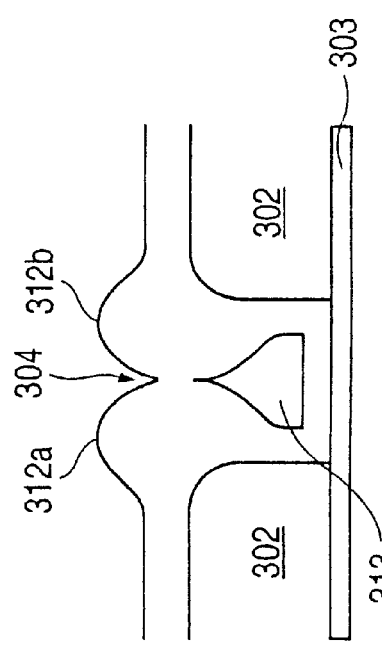
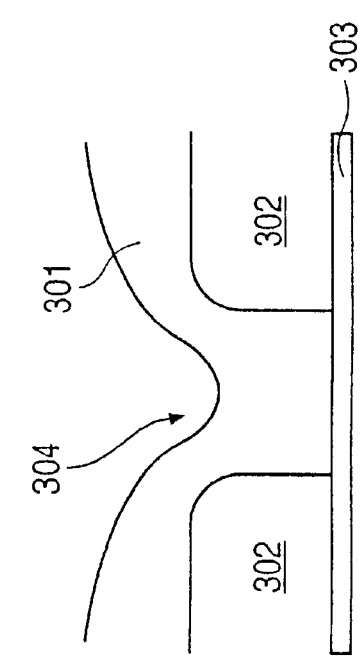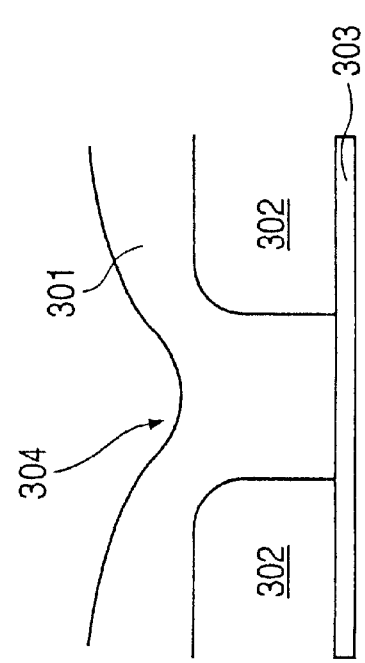
FIG. 5A  FIG. 5B (PRIOR ART)
FIG. 6A  FIG. 6B (PRIOR ART)

HOT METALLIZATION PROCESS

BACKGROUND OF THE INVENTION

1. Field of the Invention

This invention relates to metallization processes for use in making devices such as semiconductor devices, and to devices formed using those metallization processes.

2. Related Art

Formation of a metal layer is a common step in the formation of some devices, such as, for example, semiconductor devices. In particular, a metal layer can be formed so as to fill in vias or cover steps formed during fabrication of a semiconductor device. The formation of a metal layer over vias having a high aspect ratio (i.e., ratio of the depth of the via to the width or diameter of the via) or steps having a relatively large height has been subject to several problems, such as cusping and voiding.

In one previous method of forming a metal layer on a semiconductor wafer, the metal layer is formed using a two step process. In the first step, a relatively thick portion of the metal layer is deposited while the semiconductor wafer is held at a relatively cold temperature (i.e., preferably less than or equal to 200° C.). The thickness of this portion must be adequate, in view of relevant process parameters (e.g., the geometry being metallized and the metal being used), to ensure that adequate metal is present to avoid the formation of voids during the metal reflow that occurs during the second step. For example, when the metal is an aluminum alloy, this thick portion preferably has a thickness equal to about 50% to 75% of the total thickness of the metal layer to be formed. Further, this portion is preferably deposited at a rate greater than about 150 Å/sec. In the second step, the remainder of the metal is deposited while the semiconductor wafer is held at a relatively high temperature (e.g., when the metal is an aluminum alloy, about 400° C. to about 500° C.) that allows the deposited metal to reflow through grain growth, recrystallization and bulk diffusion. The rate of deposition of the aluminum in the second step is preferably slower than that during the first step, but is preferably greater than about 50 Å/sec., and more preferably between about 100 Å/sec. and about 200 Å/sec. Further, the deposition rate can be increased during the second step to increase the process throughput. However, this method does not minimize the number of defects formed in the metal layer (such as result from cusping and/or voiding, for example) as much as desired.

In another previous method of forming a metal layer on a semiconductor wafer, the metal layer is also formed using a two step process including a first, cold deposition step followed by a second, hot deposition step. However, in this method, a relatively thin portion of the metal layer (e.g., 25% of the overall thickness) is deposited while the semiconductor wafer is held at the cold temperature, while a relatively large portion of the metal layer (e.g., 75% of the overall thickness) is deposited while the semiconductor wafer is held at the hot temperature. When the metal is an aluminum alloy, the wafer can be held at a temperature of about 200° C. for a period of about 10 seconds during the cold deposition step. During the hot deposition step, a heated gas (typically argon) is flowed against the backside of the wafer to heat the wafer and the deposited metal. The wafer can be heated to a temperature of about 375° C. to about 500° C. For the illustrative temperatures given, the wafer is typically held at that temperature for about 3–5 minutes. However, the heated gas flow is kept relatively low (e.g., less than about 15 sccm and typically in the range between about 10 sccm and about 15 sccm) so that the pressure within the process chamber can be kept low (e.g., less than about 2 mtorr). Since the heated gas flow is kept relatively low, the wafer is not heated as fast as is desirable to minimize the number of defects formed (e.g., by cusping and/or voiding) in the metal layer. Increasing the temperature of the heated gas has been tried as a means to improve this method; however, the increased gas temperature causes the steady state temperature of the wafer during the hot deposition step to increase, thus increasing the likelihood of damaging the wafer (in particular, metallization that has been previously formed on the wafer). Causing the heated gas to impinge on the wafer at multiple locations has also been tried; however, while this can cause the distribution of defects to be more evenly spread throughout the metal layer, it does not adequately reduce the overall number of defects.

SUMMARY OF THE INVENTION

The invention enables a layer of metal to be formed on a substrate with few or no voids formed in the layer. According to the invention, a layer of metal can be formed on a substrate using a cold deposition step followed by a hot deposition step. The cold deposition step need only be performed for a time sufficient to deposit metal over the entire surface on which the metal layer is to be formed. In the hot deposition step, further metal may be deposited while the substrate is rapidly heated to a target temperature. In particular, the invention enables the substrate to be heated more rapidly than has been the case in previous methods for depositing a metal layer using a cold deposition step followed by a hot deposition step. The rapid heating of the substrate results in the rapid heating of the metal deposited on the substrate. Heating this metal quickly causes the metal atoms to become mobile very quickly; in particular, the mobility of the most recently deposited metal atoms (which are typically furthest from the site of heat application) is enhanced. As a result, the deposited metal is far less susceptible to cusping and voiding than has been the case with previous methods for depositing a metal layer on a substrate. The rapid heating of the substrate can be accomplished by, for example, flowing a heated gas against the substrate at a flow rate that is higher than heretofore thought feasible.

The invention provides several advantages over previous methods of forming a metal layer. First, the invention enables a hot deposition step to be completed in a shorter period of time than has been the case in previous similar methods, thus providing increased throughput. Additionally, the invention may produce metal layers having few or no voids and, in particular, fewer voids than produced by previous methods. In particular, the invention can be used to reliably (i.e., so that 100% step coverage is achieved) fill tapered vias having an aspect ratio greater than 1:1, particularly when the via depth is about 0.5 micrometers or less. Further, the invention enables these advantages to be accomplished without increasing the temperature to which the substrate is heated, thus avoiding the increased potential for damage to the substrate and/or previously deposited or formed layers, lines or other structures associated with the use of higher temperatures.

In one embodiment of the invention, a method of forming a layer of metal on a surface of a substrate includes the steps of depositing a first amount of the metal on the substrate surface, then depositing a second amount of metal on the first amount of metal while heating the substrate from a cold temperature to about 95% of a target hot temperature at an average rate that is greater than or equal to about 10° C./sec., more preferably greater than or equal to about 15° C./sec., and most preferably greater than or equal to about 25° C./sec. The deposition of the first amount of metal need only be performed long enough to ensure that the metal is deposited to cover the substrate surface. The deposition of the second amount of metal can occur for long enough to complete the formation of the metal layer. Alternatively, the heating can be discontinued before the metal layer is complete and the remaining amount of metal deposited without application of heat (e.g., as the substrate cools). Heating the substrate quickly causes the atoms of the deposited metal to become mobile very quickly (for example, increases the mobility of the atoms enough to help the deposited atoms move and/or migrate after they are deposited on the substrate). As a result, the deposited metal is less susceptible to cusping and voiding than has been the case with previous methods for depositing a metal layer on a substrate. Moreover, the rapid heating enables such deposition to be accomplished in a shorter time period than has previously been possible, increasing throughput.

In another embodiment of the invention, a method of forming a layer of metal of a predetermined thickness on a first surface of a substrate includes the steps of depositing a first amount of the metal on the substrate surface, then depositing a second amount of metal on the first amount while flowing a heated gas against the substrate at a gas flow rate that is greater than or equal to about 15 sccm, more preferably greater than or equal to about 20 sccm, and most preferably greater than or equal to about 30 sccm. As in the previous embodiment, the deposition of the first amount of metal need only be performed long enough to ensure that the metal is deposited to cover the substrate surface. The gas can be, for example, argon or other inert gas. (The particular flow rate may depend to some degree on the gas used.) The deposited metal can be any appropriate metal, such as, for example, aluminum. Impinging the heating gas on the substrate at such high flow rates enables heat to be transferred to the substrate more quickly, thus enabling the substrate temperature to be increased rapidly, with attendant benefits, as discussed above. Further, the use of such high flow rates enables such rapid heating to be accomplished without raising the temperature of the heating gas, thereby avoiding the increased possibility of damaging the substrate and/or structures formed thereon associated with the use of higher gas temperatures.

In yet another embodiment of the invention, a substrate having first and second opposing surfaces is positioned within a process chamber and a method of forming a layer of metal on the substrate includes the steps of flowing a first gas into the process chamber at a location proximate to the first surface, then, after a predetermined amount of time, flowing a second gas into the process chamber so that the second gas, which is heated, flows against the second surface of the substrate, thereby causing the temperature of the substrate to increase. The first and second gases can be, for example, argon or other inert gas. The first gas interacts with a source of the metal in the process chamber to cause metal from the metal source to be deposited on the first surface of the substrate. The predetermined amount of time before flowing the second gas into the process chamber is sufficiently long to ensure that metal is deposited to cover the first substrate surface. When the second gas is flowed, the flow rates of the first and second gases are controlled so that the differential pressure across the substrate is not sufficient to cause-the substrate to experience mechanical failure. This can be accomplished by controlling the ratio of the flow rate of the first gas to the flow rate of the second gas to be greater than or equal to about 2 and less than or equal to about 4, or, in a further embodiment, greater than or equal to about 2.5 and less than or equal to about 3. The flow rate of the first gas can be, for example, greater than or equal to about 40 sccm, more preferably greater than or equal to about 50 sccm, and most preferably greater than or equal to about 80 sccm. The flow rate of the second gas can be, for example, greater than or equal to about 15 sccm, more preferably greater than or equal to about 20 sccm, and most preferably greater than or equal to about 30 sccm. The pressure within the process chamber can also be controlled to be greater than or equal to about 2 mtorr. Such control of the gas flow rates enables a relatively high flow rate to be used for the second gas, thus enabling the temperature of the substrate to be increased more rapidly than previously possible, as discussed above.

BRIEF DESCRIPTION OF THE DRAWINGS

FIG. 5A is a cross-sectional view of the portion of the semiconductor substrate shown in FIG. 4A, at a later time during the hot metal deposition step than that shown in FIG. 4A. FIG. 5B is a cross-sectional view of a portion of a semiconductor substrate during a hot metal deposition step of a previous hot metal deposition method, after deposition of about the same amount of metal as that shown in FIG. 5A.

FIG. 6A is a cross-sectional view of the portion of the semiconductor substrate shown in FIGS. 4A and 5A, near completion of the hot metal deposition step shown partially completed in FIGS. 4A and 5A. FIG. 6B is a cross-sectional view of a portion of a semiconductor substrate during a hot metal deposition step of a previous hot metal deposition method, after deposition of about the same amount of metal as that shown in FIG. 6A.

DETAILED DESCRIPTION OF THE INVENTION

Figure 1:
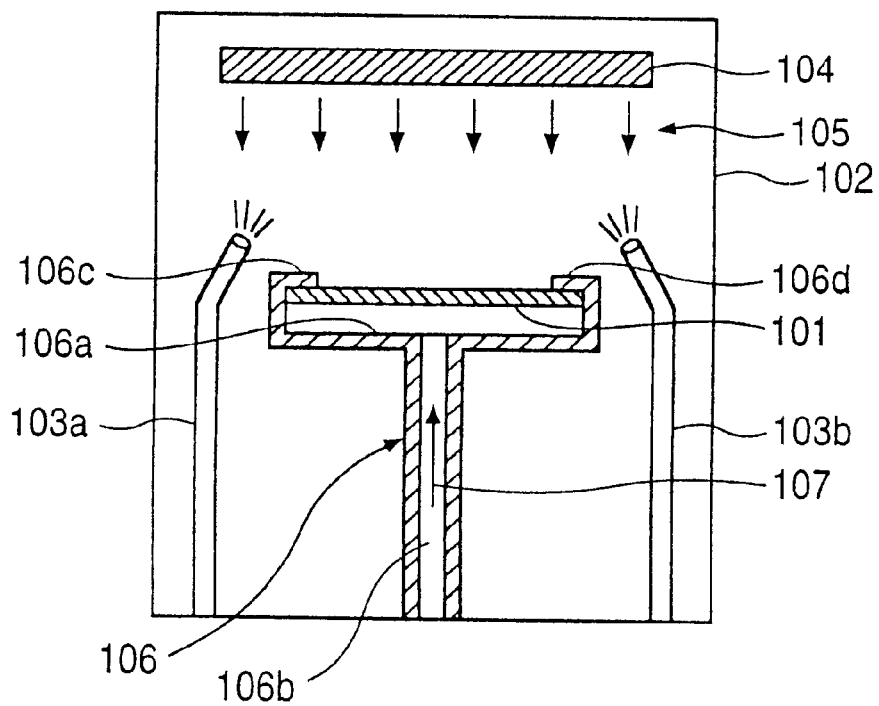
FIG. 1 is a simplified cross-sectional view of an apparatus with which the invention can be implemented.

FIG. 1 is a simplified cross-sectional view of an apparatus with which the invention can be implemented. As shown in FIG. 1, the apparatus is a conventional sputtering chamber. However, generally, the apparatus can be any apparatus that is configured to enable a metal to be deposited on a surface of a substrate.

A substrate 101 (e.g., a semiconductor wafer) is positioned within a process chamber 102. As is well known to those skilled in the art of sputtering, the process chamber 102 is held at a vacuum pressure and a sputtering gas is injected into the process chamber 102 through one or more gas jets (two gas jets 103a and 103b are shown in FIG. 1), the gas is ionized, and the ions are accelerated toward a sputtering target 104. A metal to be deposited on a surface of the substrate 101 (the upper surface as shown in FIG. 1) is formed on the sputtering target 104 so that when the sputtering gas ions strike the sputtering target 104, atoms of the metal (shown generally by the arrows designated by the numeral 105) are dislodged from the sputtering target 104. Some of the dislodged metal atoms are deposited on the upper surface of the substrate 101, thus forming a metal layer on the substrate 101.

Initially, the substrate 101 may be supported on a substrate support surface 106a of a substrate support 106. As will be better appreciated from the description below, during a first step of a method according to the invention, metal is deposited on the upper substrate surface while the substrate 101 is supported on the substrate support surface 106a. As will also be better appreciated from the description below, during a second step of a method according to the invention, a heated gas (shown generally by the arrow designated by the numeral 107) flows through a channel 106b formed in the substrate support 106 to impact a surface (the bottom surface as shown in FIG. 1) of the substrate 101, forcing the substrate 101 away from the substrate support surface 106a and against substrate retention arms 106c and 106d which may be formed on the substrate support 106. The substrate 101 is held in place against the substrate retention arms 106c and 106d by the gas 107 while metal is deposited on the upper substrate surface during the second step (this position is shown in FIG. 1). Though FIG. 1 shows a single heating gas inlet (channel 106b), it is to be understood that the heating gas can be supplied through any number of heating gas inlets, that the heating gas inlets can be positioned at any location proximate to the substrate bottom surface, and that the heating gas inlets can be configured to impinge the heating gas against the substrate 101 at any angle.

The invention can be implemented, for example, using an Endura sputtering system made by Applied Materials of Santa Clara, Calif. Below, exemplary magnitudes are given for certain aspects of the invention, such as heating gas and sputtering gas flow rates, heating gas temperatures, substrate temperatures, and duration of certain process steps. These magnitudes relate particularly to implementation of the invention using an Endura sputtering system. However, the magnitudes are expected to be similar for other sputtering systems. The qualitative relationships of such quantities are also expected to be the same. In particular, relationships between certain quantities are expected to be approximately the same for other sputtering systems, such as, for example, the ratio of the sputtering gas flow rate to the heating gas flow rate, and the relative durations of certain steps of methods of the invention and previous hot metal methods.

Figure 2:
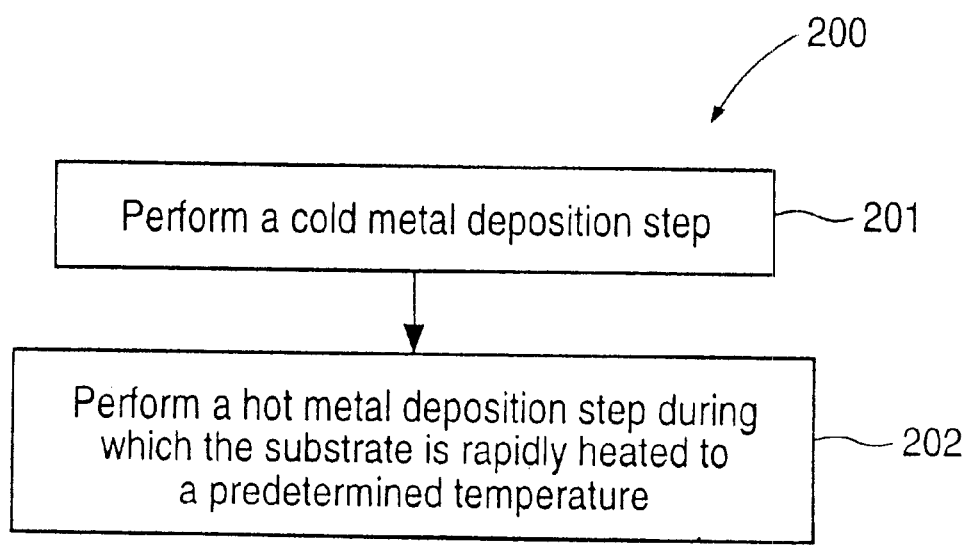
FIG. 2 is a flow chart of a method, according to an embodiment of the invention, for forming a metal layer on a substrate.

FIG. 2 is a flow chart of a method 200, according to an embodiment of the invention, for forming a metal layer on a substrate. The method 200 includes a "cold" deposition step 201 in which the metal is deposited while the substrate is at a relatively low temperature and a "hot" deposition step 202 in which the metal is deposited while the substrate is at a relatively high temperature. Heating of the substrate during the hot deposition step 202 causes the metal deposited during the cold deposition step 201 (and, eventually, metal subsequently deposited during the hot deposition step 202) to heat up. Heating of the metal deposited on the substrate increases the mobility of the metal atoms, thereby causing the metal to disperse more evenly over the substrate surface and decreasing the tendency of the metal to cusp and/or void. A key aspect of the invention is that the substrate is heated more rapidly during the hot deposition step than has been the case in other metallization methods including a hot deposition step. Thus, the mobility of the metal atoms is increased more quickly than has previously been the case. In particular, the mobility of atoms distant from the surface of the substrate is increased more quickly than in other methods, thus inhibiting cusping and/or voiding more effectively than has previously been possible.

In the cold deposition step 201, a first amount of the metal is deposited on the substrate surface. During the step 201, the temperature of the substrate is typically elevated above the ambient atmospheric temperature. For example, when the substrate is a semiconductor wafer, typically the first amount is deposited shortly after the wafer has been processed in some other manner, such as deposition of a wetting layer of titanium or titanium-tungsten, that causes the temperature of the wafer to be elevated. Illustratively, the temperature of the wafer during the step 201 can be from about 40° C. to about 250° C., and preferably about 200° C. (As will be apparent from the description below, this temperature is less than the temperature of the wafer during the step 202; hence the step 201 is referred to as the "cold" deposition step.)

During the hot deposition step 202, the substrate is heated from the temperature during the cold deposition step 201 (the initial temperature or "cold temperature") to a target ("hot") temperature. The target temperature is chosen as a tradeoff between the beneficial increased mobility of metal atoms of the deposited metal layer that is associated with an increase in the target temperature, and the detrimental increased chance of causing damage to the substrate (such as, for example, causing reflow of metallization that has been previously formed on the substrate) that is also associated with an increase in the target temperature. Illustratively, when the metal is aluminum, the substrate can be heated to a temperature of up to about 500° C. when forming a first layer of aluminum on the substrate, and about 430° C. when forming a second layer of aluminum on the substrate. (It is desirable, in general, to heat the substrate to a lower temperature when other metal layers are already present on the substrate, in order to minimize the possibility of damaging, e.g., reflowing, those layers.) If argon is used as the heating gas, the temperature of the argon is established as about 550° C. and 500° C., respectively, to heat the substrate to those temperatures.

As mentioned above, the invention heats up the substrate more quickly than has previously been the case. In one embodiment of the invention, the substrate is heated from the initial or cold temperature to about 95% of the target temperature at an average rate that is greater than or equal to about 10° C./sec. In a further embodiment, the substrate is so heated at an average rate that is greater than or equal to about 15° C./sec. In a still further embodiment, the substrate is so heated at an average rate that is greater than or equal to about 25° C./sec. In a particular embodiment in which the heating gas is argon, the metal is aluminum, and the substrate is heated from an initial temperature of about 200° C. at the beginning of the hot deposition step to a target temperature of about 500° C., the invention enables the substrate to be heated to about 95% of the target hot temperature in about 10 seconds. In contrast, one previous hot metal method (see description below) requires from 30 seconds to a minute to heat the substrate to the target temperature under the same conditions.

The substrate can be heated by impinging a heated gas against the substrate as described above with respect to FIG. 1. Any appropriate gas can be used as the heating gas (e.g., any gas that doesn't react with the metal being deposited or other materials formed on or in the substrate), though the heating gas should be the same as other gas(es) used in the process chamber, e.g., the sputtering gas injected into the process chamber 102 through the gas jets 103a and 103b in FIG. 1. For example, any inert gas, such as helium, neon or argon can be used. Argon, in particular, is a typical gas used to sputter metal, and is well-suited for use with the invention.

In a previous method (hereinafter, the "previous hot metal method"), as discussed above, a hot deposition step has been implemented by heating a semiconductor wafer with argon gas while sputtering aluminum. In that method, after performing a cold deposition step for about 10 seconds to deposit a relatively small amount of aluminum (e.g., an amount having a thickness that is about 25% of the overall thickness), the argon is flowed against the substrate at a rate of less than or equal to about 15 sccm (e.g., 10–15 sccm) at a temperature of between 450° C. to 550° C. for a period of greater than or equal to about 4 minutes. In this method, argon for use in sputtering is also flowed into the process chamber at a rate of about 40 sccm (e.g., 30–50 sccm). The combined gas flows, together with the operation of a standard exhaust mechanism, create a pressure of 2 mtorr in the process chamber. It has been believed that chamber pressures higher than about 2 mtorr are undesirable because, for example, chamber pressures above that magnitude result in a longest mean free path of the metal atoms being deposited that is too small to ensure that an adequate number of metal atoms reach the bottom of vias (particularly those with relatively high aspect ratios). Thus, it has been thought necessary to maintain a combined gas flow having a magnitude as described above to ensure a sufficiently low chamber pressure.

It would be desirable to increase the flow rate of the heating gas in order to increase the rate at which the temperature of the substrate is increased (thereby increasing the mobility of the deposited metal atoms and, consequently, reducing cusping and/or voiding in the deposited metal); however, in view of the above, such an increase must come at the expense of a decrease in the flow rate of the sputtering gas. This is undesirable because it may affect uniformity and because such a change in flow rates creates a differential pressure across the substrate that may cause the substrate to break.

Contrary to the teaching of previous methods of forming a metal layer on a substrate by performing a cold metal deposition step followed by a hot metal deposition step, the invention enables a substrate to be heated up during the hot metal deposition step at a rate faster than heretofore possible by increasing the flow rate of a heating gas used to heat the substrate above the flow rates that have previously been thought feasible. In one embodiment of the invention, the flow rate of the heating gas is greater than or equal to about 15 sccm. In a further embodiment, the flow rate of the heating gas is greater than or equal to about 20 sccm. In a still further embodiment, the flow rate of the heating gas is greater than or equal to about 30 sccm. In yet a further embodiment, the flow rate of the heating gas is greater than or equal to about 40 sccm.

To inhibit or prevent the risk of mechanical failure (e.g., breakage) of the substrate as a result of an increased differential pressure across the substrate, the flow rate of the sputtering gas can also be increased to reduce or minimize such differential pressure. Generally, it may be desirable to maintain about the same ratio of the flow rate of the sputtering gas to the flow rate of the heating gas that has been used successfully in previous methods (e.g., the previous hot metal deposition method described above). Thus, in one embodiment of the invention, the flow rate of the sputtering gas is greater than or equal to about 2 times the flow rate of the heating gas, and in another embodiment, the flow rate of the sputtering gas is greater than or equal to about 2.5 times the flow rate of the heating gas. In still another embodiment of the invention, the flow rate of the sputtering gas is less than or equal to about 4 times the flow rate of the heating gas, and in yet another embodiment, the flow rate of the sputtering gas is less than or equal to about 3 times the flow rate of the heating gas.

In another embodiment of the invention, the flow rates of the sputtering gas and the heating gas are controlled so that the differential pressure across the substrate is not sufficient to cause the substrate to experience mechanical failure, and so that the pressure within the process chamber is greater than or equal to about 2 mtorr. In a further embodiment, the chamber pressure is greater than or equal to about 3 mtorr, and in a still further embodiment, the chamber pressure is greater or equal to 4 mtorr. The chamber pressure can be controlled by, in addition to control of the gas flow rates, control of the exhaust mechanism (e.g., varying of the exhaust pump speed, employing an exhaust means equipped with a check valve or pressure regulator, etc.).

In one particular embodiment, the flow rate of the sputtering gas is greater than or equal to about 40 sccm and the flow rate of the heating gas is greater than or equal to about 15 sccm. In further particular embodiment, the flow rate of the sputtering gas is greater than or equal to about 50 sccm and the flow rate of the heating gas is greater than or equal to about 20 sccm. In a still further particular embodiment, the flow rate of the sputtering gas is greater than or equal to about 80 sccm and the flow rate of the heating gas is greater than or equal to about 30 sccm. In this last embodiment, the chamber pressure is about 6 mtorr.

Thus, as can be seen above, according to the invention, the flow rate of the heating gas and the chamber pressure are increased above that previously thought to be the maximum desirable magnitudes, without significant adverse consequences. The invention enables a hot deposition step to be completed more quickly than previously possible (e.g., less than or equal to about 3 minutes for a hot deposition step that, as discussed above, required 3–5 minutes in one previous hot metal method), with formation of few or no voids in the deposited metal layer. It is believed that this is so, notwithstanding the likely decrease (associated with the increased chamber pressure) in mean free path of the metal atoms being deposited, because that detrimental effect (if present) is more than offset by the beneficial effect of increased mobility of the deposited metal atoms that results from the rapid increase in substrate temperature.

Additionally, as discussed above, increasing the temperature of the heating gas has been tried as a means to quicken the rate at which the substrate temperature is increased. However, this has been found to be undesirable, since the substrate temperature is increased more than desired (increasing the chances of damaging previously deposited metal layers or structures on or in the substrate). The invention enables the substrate to be heated rapidly without increasing the temperature of the heating gas.

Since less heated gas is introduced into the process chamber during the cold deposition step 201, the chamber pressure is lower during the step 201 than during the hot deposition step 202, thus enabling the metal to be deposited more quickly during the cold deposition step 201 than during the hot deposition step 202. However, since the mobility of the metal atoms deposited on the substrate decreases with decreasing temperature, the metal atoms are not as mobile during the cold deposition step 201 as during the hot deposition step 202, increasing the likelihood that cusping and/or voiding may occur as metal is deposited into high aspect ratio vias or deep steps during the cold deposition step 201. Thus, the cold deposition step 201 is desirably made short to minimize or eliminate problems with cusping and/or voiding.

Further, only enough of the metal need be deposited in the cold deposition step 201 to ensure that all parts of the surface on which the layer of metal is to be formed are covered with the metal, so that a good wetting layer is provided for the deposition during the subsequent hot deposition step 202. Thus, in one embodiment of the invention, the step 201 is performed for a predetermined amount of time that is sufficiently long to ensure that the metal is deposited to cover the substrate surface. The exact length of the predetermined amount of time can vary according to a variety of process parameters, such as the metal being deposited, the type of sputtering gas and the geometry (e.g., via aspect ratio, step height) on which the metal is being deposited. Illustratively, an amount of metal less than or equal to about 25% of the overall thickness of the metal layer to be formed can be deposited during the cold deposition step 201. Illustratively, when aluminum is being deposited using argon as a sputtering gas, the cold deposition step 201 can be performed for less than or equal to about 10 seconds.

Figure 3:
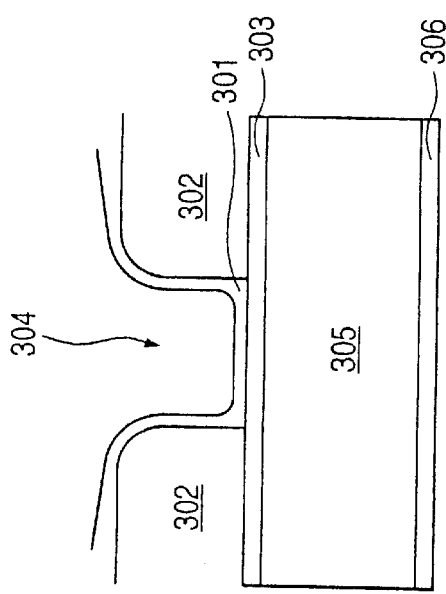
FIG. 3 is a cross-sectional view of a semiconductor substrate after completion of a cold metal deposition step of a method according to the invention.

FIG. 3 is a cross-sectional view of a semiconductor substrate after completion of a cold metal deposition step of a method according to the invention,.e.g., the cold deposition step 201 of the method 200. (Since the cold deposition step 201 of the method 200 is similar to that of the cold deposition step of the previous hot metal method described above, the cross-sectional view of FIG. 3 is also illustrative of a semiconductor substrate after completion of the cold step of that previous hot metal method.) The metal 301 shown in FIG. 3 is a first amount deposited during the cold metal deposition step of the invention. The metal 301 may be deposited in a via 304 formed in oxide 302 that was previously formed over a metal layer 305. A wetting layer 303 (described in more detail below) is also shown in FIG. 3. While the wetting layer 303 need not necessarily be present, the presence of the wetting layer 303 can, in practice, increase the yield associated with the method of the invention. As can be seen, at the end of the cold metal deposition step, the thickness of the metal 301 is relatively small, e.g., perhaps 25% or less of the overall thickness of the layer of metal produced by the method of the invention.

Figure 4B:
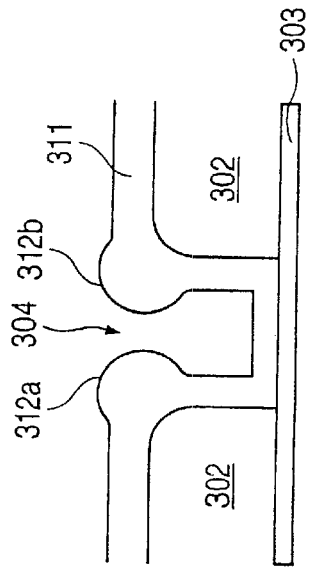
FIG. 4B is a cross-sectional view of a portion of a semiconductor substrate during a hot metal deposition step of a previous hot metal deposition method, after deposition of about the same amount of metal as that shown in FIG. 4A.
Figure 4A:
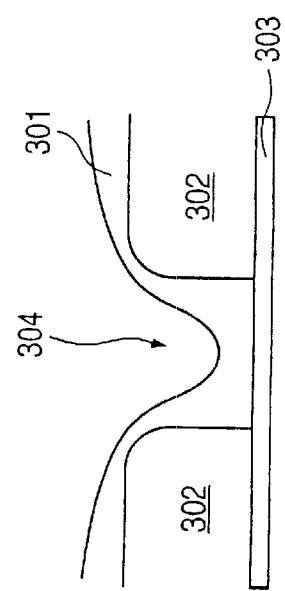
FIG. 4A is a cross-sectional view of a portion of a semiconductor substrate after partial completion of a hot metal deposition step of a method according to the invention.

FIGS. 4A, 5A and 6A are cross-sectional views of a portion of the semiconductor substrate shown in FIG. 3 after progressively greater completion of a hot metal deposition step of a method according to the invention. FIGS. 4B, 5B and 6B are cross-sectional views of the same portion of the semiconductor substrate after deposition of an amount of metal similar to that shown in the corresponding FIGS. 4A, 5A and 6A during a previous hot metal deposition method. In FIG. 4B (resultant from the previous method), cusps 312a and 312b are beginning to form where the metal 311 is deposited over the corners of the oxide 302. In FIG. 4A (representative of the present invention), on the other hand, the metal 301 smoothly fills in the via 304. The greater mobility of the atoms of the metal 301, as compared to the atoms of the metal 311, caused by the more rapid heating of the substrate, produces this result. Comparison of FIGS. 5A and 5B shows that the difference in results produced by the method of the invention and the previous hot metal deposition method has been accentuated over time. Finally, in FIG. 6B, the cusps 312a and 312b produced by the previous hot metal deposition method join so that a void 313 is formed. In FIG. 6A, on the other hand, the present method results in the metal 301 smoothly filling the via 304.

Figure 7:
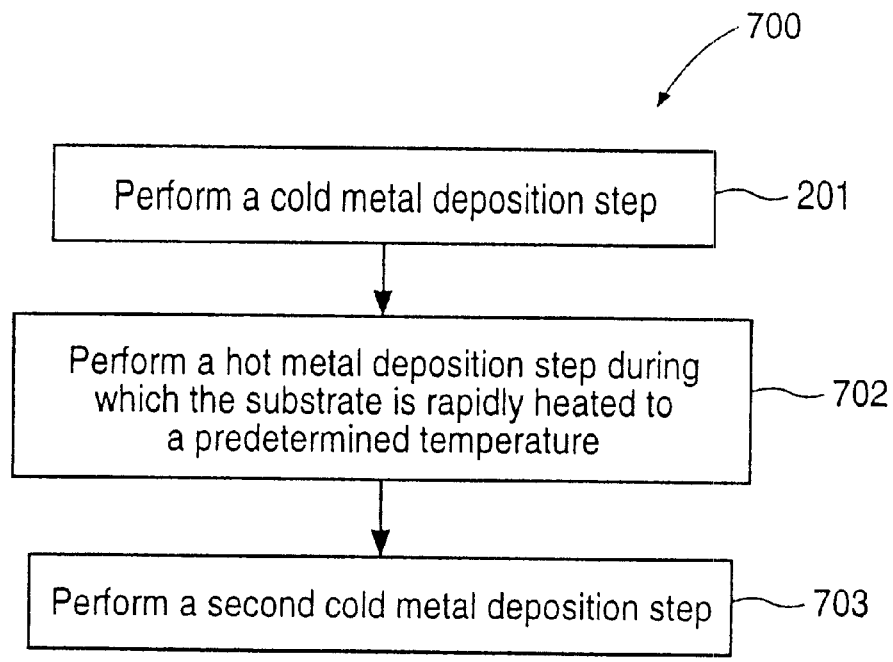
FIG. 7 is a flow chart of a method, according to another embodiment of the invention, for forming a metal layer on a substrate.

FIG. 7 is a flow chart of a method 700, according to another embodiment of the invention, for forming a metal layer on a substrate. To begin the method 700, the step 201 is performed, as described above with respect to the method 200 shown in FIG. 2, to deposit a first amount of metal. As indicated above, the step 201 can be performed for a period of time necessary to ensure that the entire surface on which the metal layer is to be formed is covered with metal; illustratively, the step 201 can be performed for about 10 seconds when aluminum is being deposited using argon as a sputtering gas.

Next, a step 702 is performed in which the substrate is heated while a second amount of metal is deposited on the first amount deposited during the step 201. The step 702 is similar to the step 202 of the method 200 described above (FIG. 2), differing only in the duration of the step: unlike the step 202, the step 702 is not performed until deposition of the remaining metal necessary to form a metal layer of desired thickness, and is, therefore, typically shorter in duration than the step 202. The step 702 can be performed for a specified amount of time or until a specified amount of metal has been deposited. Illustratively, when aluminum is being deposited using argon as a sputtering gas, the step 702 can be performed for about 2 minutes when the step 702 and a cold metal deposition step 703 (described below) having a duration of 10 seconds are performed in place of a hot deposition step 202 having a duration of 3 minutes.

The method 700 ends with the step 703 in which a second cold deposition is performed. The step 703 is similar to the step 201 in that heat is not supplied to the substrate. However, typically, the temperature of the substrate during the cold deposition step 703 is higher than that during the cold deposition step 201, since the substrate has been heated up during the hot deposition step 702. During the cold deposition step 703, the remaining metal necessary to form a metal layer of the desired thickness is deposited. Illustratively, when aluminum is being deposited using argon as a sputtering gas, the step 703 can be performed for about 10 seconds (as discussed above). Since a cold deposition step can deposit metal at a faster rate than a hot deposition step (a ten second cold deposition step 703 in the method 700 can replace approximately the last minute of the hot deposition step 202 of the method 200), and since the danger of cusping and voiding is relatively minimal near the end of the deposition of a metal layer, the use of a cold deposition step to finish the deposition can advantageously shorten the overall time required to deposit the metal layer, with little increase in the danger of formation of defects in the metal layer.

The cold and hot deposition steps of the methods 200 and 700 can advantageously be performed in the same process chamber, thus avoiding the decrease in throughput associated with moving the substrate between process chambers. However, a method according to the invention can also be implemented so that more than one process chamber is used to implement the steps of the method.

The steps of the methods 200 and 700 described above are typically preceded and followed by a number of other steps.

These other steps are typically performed in processing chambers other than that used to implement a method of the invention. For example, the following describes a process sequence that can encompass the steps of a method according to the invention. First, a conventional degassing procedure can be performed to remove moisture from a dielectric layer or layers on which a metal layer or layers are to be formed. Next, a conventional etching procedure (e.g., a conventional sputter etch procedure) can be performed to remove portions of the dielectric layer(s) to create vias or steps. Then, a wetting layer (e.g., 100 to 300 angstroms of titanium, a composition of titanium and tungsten, or other suitable material) can be deposited (using a conventional deposition process) on the surface or surfaces on which a metal layer or layers are to be formed. Next, a method according to the invention is used to deposit the desired amount of metal in the desired location or locations. The metal deposition can be followed by further processing steps, such as a conventional anti-reflective coating (ARC), using conventional techniques. Finally, the substrate can be cooled according to a standard cooling procedure for a specified time (e.g., 30 seconds). It is to be understood that a method according to the invention is not confined to use with the process sequence described immediately preceding, and that a method according to the invention can be part of other process sequences that include some or all of the above-described steps, none of the above-described steps, and/or other steps not described above.

Figure 8:
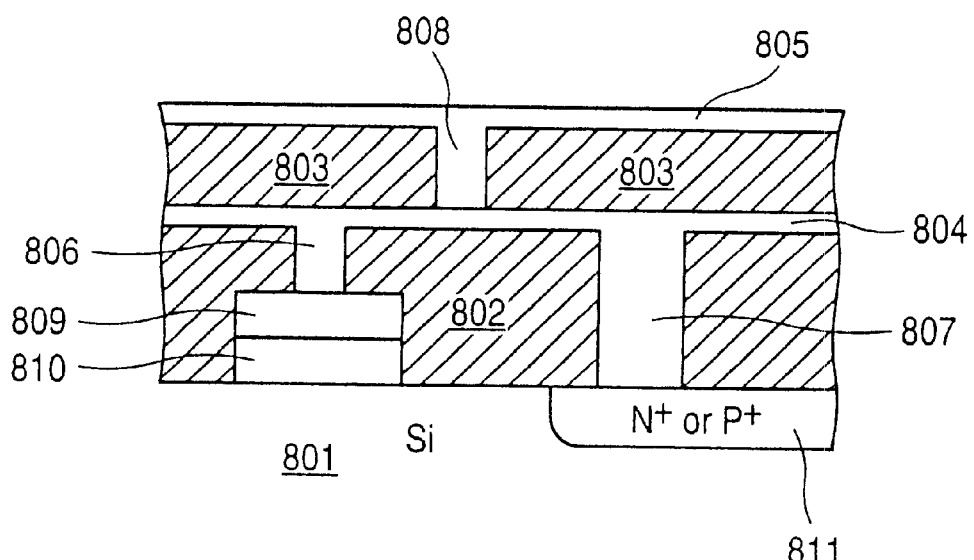
FIG. 8 is a cross-sectional view of a semiconductor substrate on which various layers of metal have been formed, illustrating several applications of a method according to the invention.

The invention can be used, for example, to form various types of metallization on a semiconductor substrate (e.g., a semiconductor wafer). FIG. 8 is a cross-sectional view of a semiconductor substrate on which various metal layers have been formed, illustrating several applications of a method according to the invention. For example, a metal layer 804 formed on the dielectric layer 802 may be electrically connected to a polysilicon gate 809 formed on oxide 810 by a metal contact 806 that extends through a dielectric layer 802. Similarly, metal layer 804 may be electrically connected to an electrically doped region 811 of the silicon substrate 801 by a metal contact 807 that extends through a dielectric layer 802. A second metal layer 805 formed on the dielectric layer 803 that overlies the first metal layer 804 may be electrically connected to the first metal layer 804 by a metal contact 808 that extends through the dielectric layer 803. When aluminum is used for the layer 804 then a barrier layer preventing or inhibiting migration of silicon atoms into the aluminum may be necessary. Examples of such a barrier layer include titanium-tungsten alloy or titanium-nitride. The barrier layer may have a layer (such as titanium) between it and the underlying structure that reduces contact resistance.

The invention is broadly applicable to the formation of a metal layer on any type of substrate or device. For example, formation of a metal layer according to the invention can be accomplished on any type of semiconductor substrate, such as a semiconductor wafer. Illustratively, the invention can be used to form metal layers in active electronic components (e.g., integrated circuit chips, transistors and diodes) and passive electronic components (e.g., resistors, capacitors and inductors). The invention can also be used to form metal layers in other types of devices, such as lead frames, medical devices, disks and heads, flat panel displays and microelectronic masks.

Various embodiments of the invention have been described. The descriptions are intended to be illustrative, not limitative. Thus, it will be apparent to one skilled in the art that certain modifications may be made to the invention as described above without departing from the scope of the claims set out below.

I claim:

1. A method of forming a layer of metal on a substrate, comprising the steps of:

depositing a first amount of the metal on a substrate surface, the first amount of metal being sufficient to cover the substrate surface;

heating the substrate from a first temperature to greater than or equal to about 95% of a second temperature at an average rate greater than or equal to about 10° C./sec.; and during and/or after the step of heating, depositing a second amount of metal on the first amount of metal.

2. A method as in claim 1, wherein the average rate is greater than or equal to about 15° C./sec.

3. A method as in claim 1, wherein the average rate is greater than or equal to about 25° C./sec.

4. A method as in claim 1, wherein the first temperature is between about 40° C. to about 250° C. inclusive and the second temperature is between about 380° C. to about 500° C. inclusive.

5. A method as in claim 1, wherein the step of heating further comprises flowing a heated gas at a predetermined temperature and gas flow rate against a second surface of the substrate, the second surface being opposite the surface on which the first amount of metal is deposited.

6. A method as in claim 1, wherein the metal is aluminum.

7. A method as in claim 1, further comprising the steps of:

cooling the substrate to a third temperature; and depositing a third amount of metal on the second amount of metal.

8. A method of forming a layer of metal on a substrate, comprising the steps of:

depositing a first amount of the metal on a first substrate surface, the first amount of metal being sufficient to cover the first substrate surface;

flowing a heated gas against a second surface of the substrate, the second surface being opposite the first surface, wherein the gas flow rate is greater than or equal to about 15 sccm; and during and/or after the step of flowing, depositing a second amount of metal on the first amount of metal.

9. A method as in claim 8, wherein the gas flow rate is greater than or equal to about 20 sccm.

10. A method as in claim 8, wherein the gas flow rate is greater than or equal to about 30 sccm.

11. A method as in claim 8, wherein the flowing step heats the substrate from a first temperature to greater than or equal to about 95% of a second temperature at an average rate of at least about 10° C./sec.

12. A method as in claim 11, wherein the first temperature is between about 40° C. to about 250° C. inclusive and the second temperature is between about 380° C. to about 500° C. inclusive.

13. A method as in claim 8, wherein the metal is aluminum.

14. A method of forming a layer of metal on a substrate, the substrate being positioned within a process chamber and having first and second opposing surfaces, the method comprising the steps of:

flowing a chamber gas into the process chamber;

flowing a heated backside gas into the process chamber against the second surface of the substrate so that the temperature of the substrate increases, wherein (a) the flow rates of the chamber and backside gases, and (b) the pressure of the process chamber are controlled so that the differential pressure across the substrate while the gases are flowing is not sufficient to cause the substrate to experience mechanical failure, and the pressure within the process chamber is greater than about 2 mtorr; and depositing a metal on the substrate during the flowing steps.

15. A method as in claim 14, wherein the ratio of the flow rate of the chamber gas to the flow rate of the heated backside gas is greater than or equal to about 2.

16. A method as in claim 14, wherein the ratio of the flow rate of the chamber gas to the flow rate of the heated backside gas is less than or equal to about 4.

17. A method as in claim 14, wherein the ratio of the flow rate of the chamber gas to the flow rate of the heated backside gas is greater than or equal to about 2.5 and less than or equal to about 3.

18. A method as in claim 14, wherein:
the flow rate of the chamber gas is greater than about 40 sccm; and
the flow rate of the heated backside gas is greater than about 15 sccm.

19. A method as in claim 18, wherein:
the flow rate of the chamber gas is greater than about 50 sccm; and
the flow rate of the heated backside gas is greater than about 20 sccm.

20. A method as in claim 19, wherein:
the flow rate of the chamber gas is greater than about 80 sccm; and
the flow rate of the heated backside gas is greater than about 30 sccm.

21. A method as in claim 14, wherein the pressure within the process chamber is greater than or equal to 4 mtorr.

22. A method as in claim 14, wherein the pressure within the process chamber is greater than or equal to about 6 mtorr.

* * * * *